United States Patent [19]

Kudo

[11] Patent Number: 5,392,094
[45] Date of Patent: Feb. 21, 1995

[54] ILLUMINATION OPTICAL SYSTEM AND EXPOSURE APPARATUS INCLUDING THE SAME SYSTEM

[75] Inventor: Yuji Kudo, Kawasaki, Japan

[73] Assignee: Nikon Corporation, Tokyo, Japan

[21] Appl. No.: 97,175

[22] Filed: Jul. 27, 1993

[30] Foreign Application Priority Data

Aug. 7, 1992 [JP] Japan .................................. 4-211220

[51] Int. Cl.$^6$ .............................................. G03B 27/54
[52] U.S. Cl. ........................................ 355/67; 355/55; 355/71
[58] Field of Search ............................. 355/55, 67, 71

[56] References Cited

U.S. PATENT DOCUMENTS

| 3,733,128 | 5/1973 | Naumann et al. | 355/45 |
| 4,497,015 | 1/1985 | Konno et al. | 362/268 |
| 4,939,630 | 7/1990 | Kikuchi et al. | 362/268 |
| 5,237,367 | 8/1993 | Kudo | 355/67 |
| 5,245,384 | 9/1993 | Mori | 355/67 |

FOREIGN PATENT DOCUMENTS

59-155843  9/1985  Japan.
4-225214   8/1992  Japan.

*Primary Examiner*—Michael L. Gellner
*Assistant Examiner*—Daniel P. Malley
*Attorney, Agent, or Firm*—Shapiro and Shapiro

[57] ABSTRACT

Disclosed is an illumination optical system comprising: a parallel beam supplying means for supplying parallel beams; a first optical integrator for forming substantially first surface illuminants by the beams coming from the parallel beam supplying means; a first converging optical system for converging the beams from the plurality of secondary illuminants; a second optical integrator for forming substantially second surface illuminants by the plurality of beams converged by the first converging optical system; and a second converging optical system for converging the beams from the second surface illuminants formed through the second optical integrator and illuminating an irradiated surface with the converged beams in superposition. At least one of the first optical integrator and the first converging optical system includes a plurality of lens systems interchangeable each other and having focal lengths different from each other. One of the plurality of lens systems is inserted in a light path. A size of the second surface illuminants is thereby made variable while maintaining an irradiated area to a fixed size.

15 Claims, 5 Drawing Sheets

ILLUMINATION OPTICAL SYSTEM AND EXPOSURE APPARATUS INCLUDING THE SAME SYSTEM

BACKGROUND OF THE INVENTION

1. Field of the Invention

The present invention relates to an illumination optical system suitable for manufacturing a semiconductor and an exposure apparatus including the same system.

2. Related Background Art

A reduction projection type exposure apparatus has hitherto been employed for manufacturing a semiconductor element such as LSI (large scale integrated circuits) and VLSI (very large scale integrated circuits) consisting of hyperfine patterns. A good deal of endeavors have continued for transferring much hyperfiner patterns. An attempt to increment a numerical aperture (hereinafter abbreviated to NA) of a projection optical system has been made with a reduction in wavelength of exposure light in order to correspond to the pattern micronization described above. There has been actualized a projection optical system exhibiting NA=0.5 or above.

Then, optimization of an illuminating condition is of much importance for the actual projection exposure wherein the projection optical system having such a large numerical aperture NA is used. Under such circumstances, for instance, Japanese Patent Laid-Open Application No. 59-155843 proposes such an arrangement that an NA ratio between two optical systems is controlled to obtain a proper balance between resolution and contrast With respect to a predetermined pattern, and this involves controlling a so-called $\sigma$-value corresponding to the ratio of NA of an illumination optical system to NA of the projection optical system.

According to the apparatus proposed therein, a variable aperture stop having a variable opening is disposed in an exit position of a fly eye lens in which a secondary illuminant (light source) image is formed in the illumination optical system. A size of the illuminant image is controlled by changing a size of the opening of this variable aperture stop. Namely, the $\sigma$-value corresponds to a ratio of size of the illuminant image, formed on the pupil of the projection optical system, of the illumination optical system to a size of the pupil of the projection optical system. Therefore, NA of the illumination optical system is substantially changed by making the illuminant image size variable with a variation in terms of light shielding degree of the actually formed illuminant image. The illuminating condition, i.e., the $\sigma$-value is thereby optimized to set the resolution and the contrast with respect to the predetermined pattern in an optimum state in accordance with a degree of micronization of the pattern undergoing the projection exposure.

Generally, a higher illuminance on an irradiated surface (mask or reticle) is demanded to improve the throughput when effecting exposure-printing of the hyperfine pattern in this type of illumination optical apparatus.

In the conventional apparatus mentioned above, however, a size of the opening of the variable aperture stop is reduced to optimize the $\sigma$-value as the illuminating condition under which the resolution and the contrast with respect to the predetermined pattern are in the optimum state in accordance with the degree of the micronization of the pattern subjected to the projection exposure. In this case, a loss in light quantity augments because of a peripheral portion of the secondary illuminant image being shielded from the light by the variable aperture stop. More specifically, when the $\sigma$-value is maximized (the aperture of the variable aperture stop is maximized), the maximum illuminance on the irradiated surface (mask or reticle) is obtained. Nevertheless, there exists a critical defect in which the throughput inevitably decreases due to a decline of the illuminance on the irradiated surface when smaller than that value (the aperture of the variable aperture stop is reduced).

SUMMARY OF THE INVENTION

It is a primary object of the present invention, which has been devised to overcome the defects given above, to provide a high-performance illumination optical apparatus capable of effecting uniform irradiation with higher illuminance by effectively utilizing and leading illumination light onto an irradiated surface at a high efficiency without causing a drop in terms of throughput due to a loss in light quantity all the time even when changing a $\sigma$-value.

To begin with, before describing the characteristics of the present invention, the apparatus defined as a premise of the construction of the present invention will be briefly explained with reference to FIG. 7.

Figure 7:
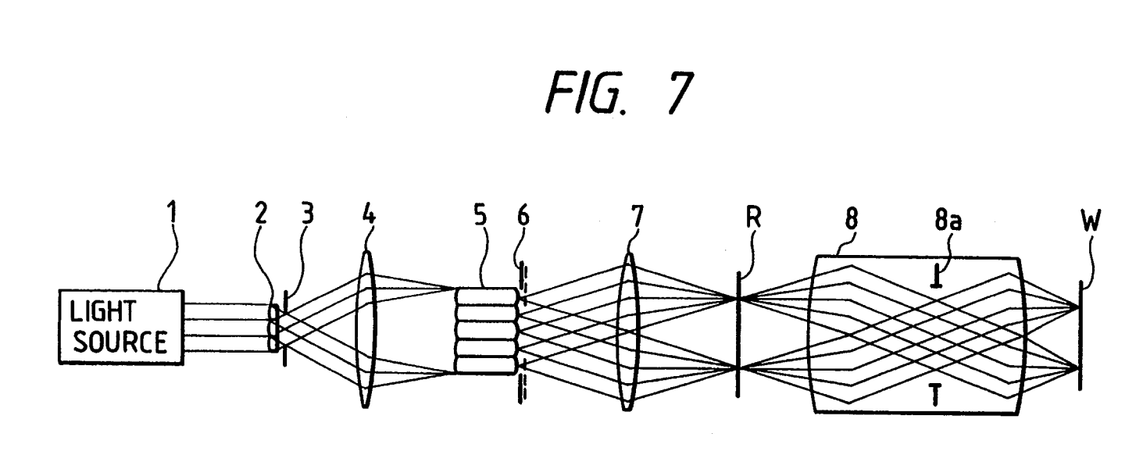
FIG. 7 is a view illustrating a light path and a configuration of an exposure apparatus incorporating the illumination optical system as a premise of the construction of the apparatus according to this invention.

FIG. 7 is a view illustrating a light path and a layout of lenses of the apparatus defined as the premise of the construction of this invention. As shown in FIG. 7, parallel beams from a light source 1 such as a laser, etc. form a multiplicity of secondary illuminants (light source), i.e., first substantially planar light source, through a first optical integrator 2 on an exit side A thereof. A fixed aperture stop 3 is provided in this position. Then, the multiplicity of beams from the secondary illuminants fall in a superposed manner on an incident surface of a second optical integrator 5 through a first condenser lens 4. Thereafter, a multiplicity of tertiary illuminants (light source), i.e., second substantially planar light source, are formed through the second optical integrator 5 on the exit side thereof. A variable aperture stop 6 is provided in this position. An irradiated surface (reticle) R is irradiated in superposition with a multiplicity of beams from the tertiary illuminants through a second condenser lens 7. More uniform illumination takes place. Then, a predetermined pattern on the reticle R is transferred on a wafer W through a projection objective lens 8. According to such an illumination apparatus, a tertiary illuminant image is formed on the pupil of the projection lens 8. So-called Kohler illumination is thus attained.

In the apparatus of FIG. 7, the $\sigma$-value described above can be changed by, as indicated by dotted lines, stopping down an aperture of the variable aperture stop provided in the position formed with the tertiary illuminants and shielding some beams of light. This, however, induces a loss in the light quantity, and, therefore, it is impossible to perform the highly efficient illumination with an optimum $\sigma$-value.

Under such circumstances, attention is paid to a variation in size of an illuminant image of an illumination optical system without causing the loss in the light quantity at all. It is because the $\sigma$-value corresponds to a ratio of size of the pupil of a projection objective lens to the size of the illuminant image of the illumination optical system which is formed on the pupil of the projection objective lens. Then, at least one of a first optical integrator for forming a plurality of secondary illuminants (substantially first surface illuminants) and a first converging optical system for converging the beams from the secondary illuminants includes a plurality of lens systems interchangeable each other and having focal lengths different from each other. One of the plurality of lens systems is inserted into a light path, thereby making variable a size of the plurality of tertiary illuminants (second surface illuminants) while maintaining an irradiated area to a fixed size. It is thus possible to change the $\sigma$-value in principle while irradiating the irradiated area uniformly with the light at a high efficiency without causing a loss in the quantity of the reflected light at all.

To accomplish the object given above, according to one aspect of the present invention, there is provided an illumination optical system comprising: a parallel beam supplying means for supplying parallel beams; a first optical integrator for forming substantially first surface illuminants by the beams coming from the parallel beam supplying means; a first converging optical system for converging the beams from the plurality of secondary illuminants; a second optical integrator for forming substantially second surface illuminants by the plurality of beams converged by the first converging optical system; and a second converging optical system for converging the beams from the second surface illuminants formed through the second optical integrator and illuminating an irradiated surface with the converged beams in superposition. At least one of the first optical integrator and the first converging optical system includes a plurality of lens systems interchangeable each other and having focal lengths different from each other. One of the plurality of lens systems is inserted in a light path, whereby a size of the second surface illuminants is made variable while maintaining an irradiated area to a fixed size.

According to another aspect of the present invention, there is provided an exposure apparatus for exposing a reticle pattern on a substrate through a projection optical system, comprising an illumination optical system for illuminating a reticle uniformly with the light. The illumination optical system includes: a parallel beam supplying means for supplying parallel beams; a first optical integrator for forming substantially first surface illuminants by the beams coming from the parallel beam supplying means; a first converging optical system for converging the beams from the plurality of secondary illuminants; a second optical integrator for forming substantially second surface illuminants by the plurality of beams converged by the first converging optical system; and a second converging optical system for converging the beams from the second surface illuminants formed through the second optical integrator and illuminating an irradiated surface with the converged beams in superposition. At least one of the first optical integrator and the first converging optical system has a plurality of lens systems interchangeable each other and having focal lengths different from each other, and one of the plurality of lens systems is inserted in a light path, whereby a size of the second surface illuminants is made variable while maintaining an irradiated area to a fixed size.

As explained above, according to the present invention, the uniform irradiation of light on the irradiated surface can take place with a high illuminance without inducing any loss in the light quantity. It is therefore possible to attain the high-performance illumination optical apparatus capable of causing no decline in throughput even when set to an optimum $\sigma$-value in accordance with a minimum line width for exposure printing and focal depth as well.

Other objects and advantages of the present invention will become apparent during the following discussion in conjunction with the accompanying drawings.

DESCRIPTION OF THE PREFERRED EMBODIMENTS

Embodiments of the present invention will next be described in greater detail with reference to-the accompanying drawings.

Figures 1A, 1B:
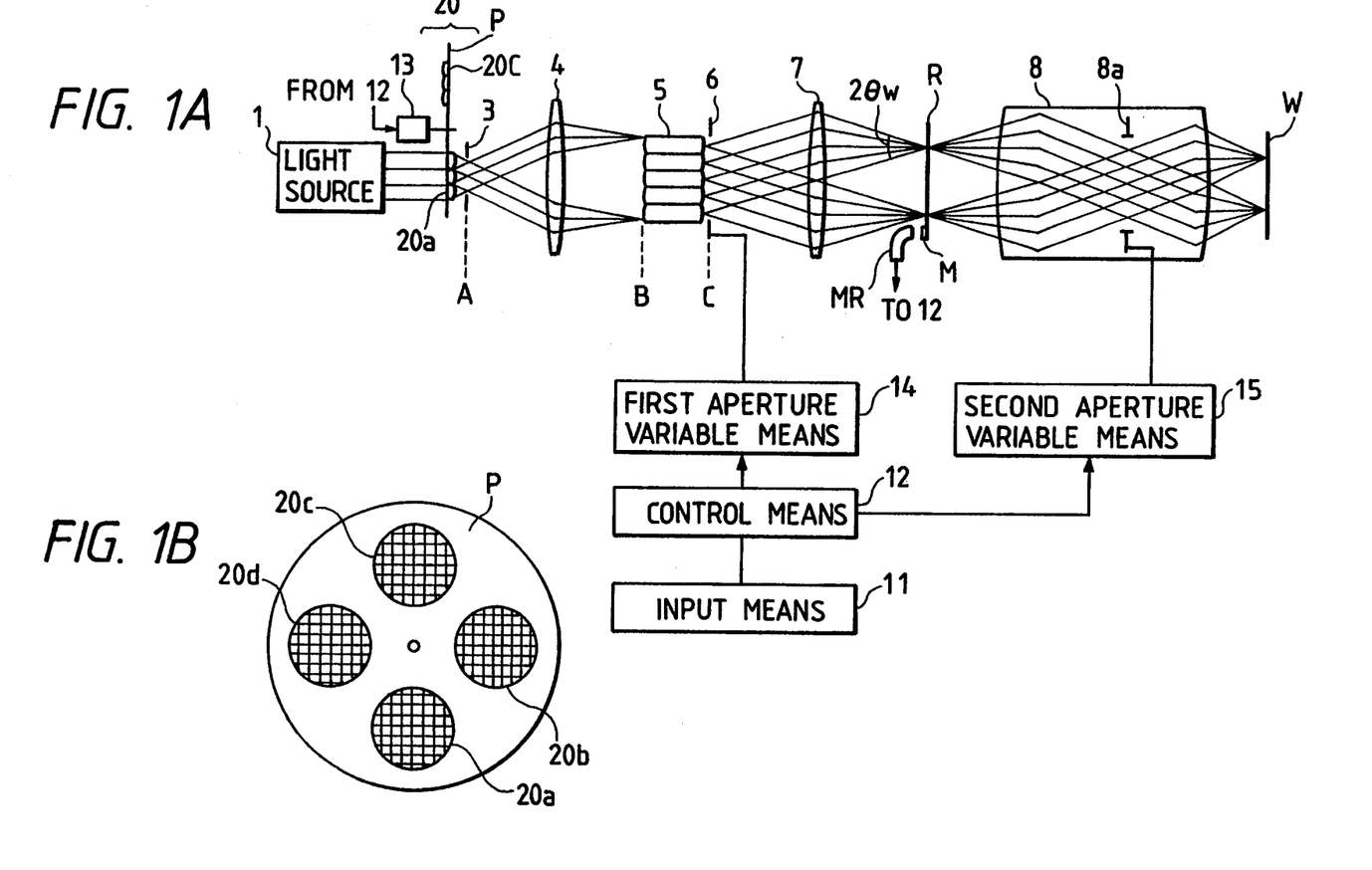
FIG. 1A is a view illustrating a construction of a first embodiment and a light path when a numerical aperture NA of an illumination optical system is maximized.
FIG. 1B is a view showing a configuration of a first optical integrator.
Figure 2:
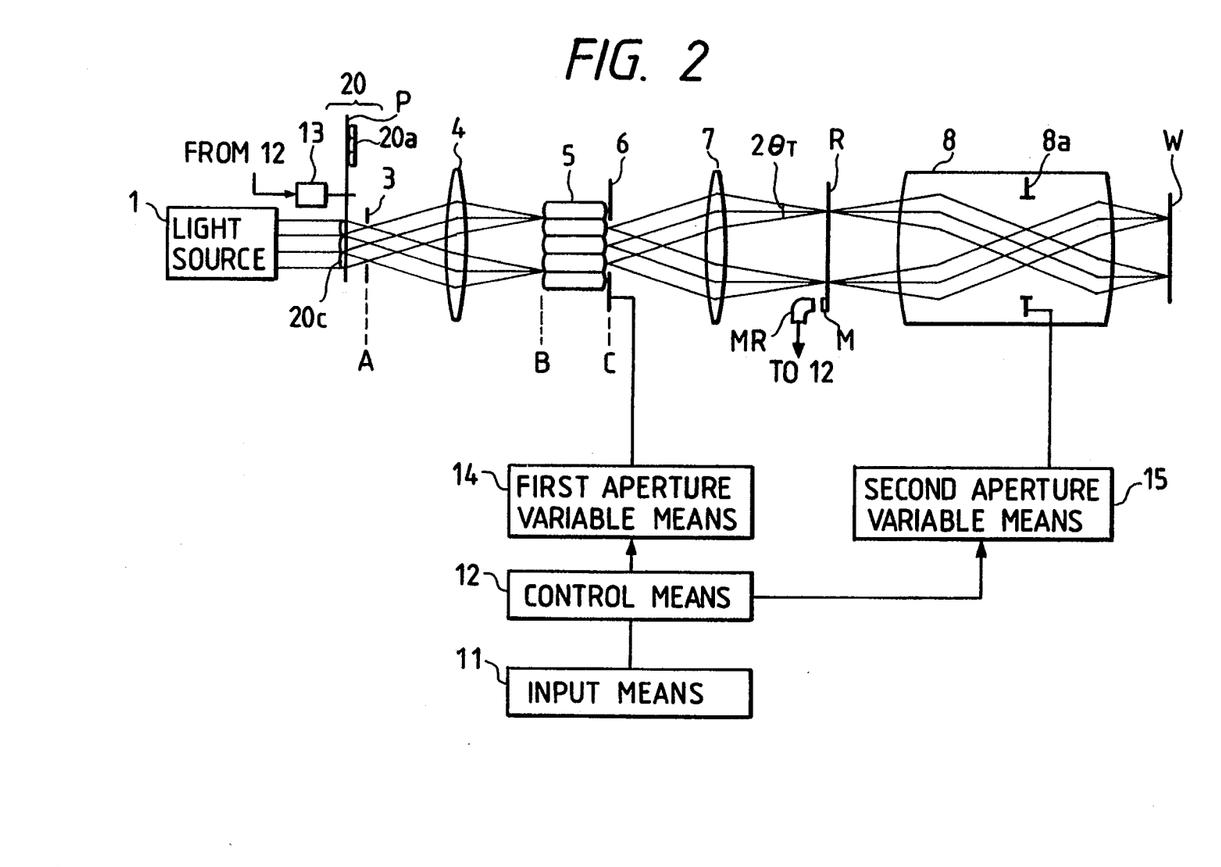
FIG. 2 is a view showing a construction of the first embodiment and a light path when the numerical aperture NA of the illumination optical system is minimized.

FIGS. 1A, 1B and 2 are views each schematically illustrating a first embodiment in which the present invention is applied to an exposure apparatus. FIG. 1A shows a state where a fly eye lens 20a is inserted into an illumination light path, the lens 20a having the shortest focal length and constituting a part of a first optical integrator 20. FIG. 1B illustrates a configuration of the optical integrator 20. Further, FIG. 2 shows a state where a fly eye lens 20c is inserted into the illumination light path, the lens 20c having the longest focal length and constituting a part of the first optical integrator 20.

To start with, as illustrated in FIG. 1A, a laser light source 1 (parallel beam supplying means) such as an excimer laser or the like for emitting beams of light in an ultraviolet zone emits parallel beams assuming a rectangular shape in section. The parallel beams fall on the fly eye lens 20a defined as a first optical element group constituting a part of the first optical integrator 20 incorporating a variable power function. The first optical integrator 20 includes, as shown in FIG. 1B, four pieces of fly eye lenses (20a–20d) serving as first to fourth optical element groups. These fly eye lenses are inset in a rotary support member P taking a circular shape. Herein, let $f_{20a}$, $f_{20b}$, $f_{20c}$, $f_{20d}$ be the focal lengths of the fly eye lenses 20a–20d. The focal lengths of the respective fly eye lenses have a relationship such as: $f_{20a} > f_{20b} > f_{20c} > f_{20d}$.

As illustrated in FIG. 1A, the rotary support member P is rotated through a driving means 13 such as a motor, etc.. The rotary support member P includes arbitrary fly eye lenses inserted in the illumination light path, whereby a size of tertiary illuminants (second surface illuminants) which will be mentioned later can be changed.

Figure 3:
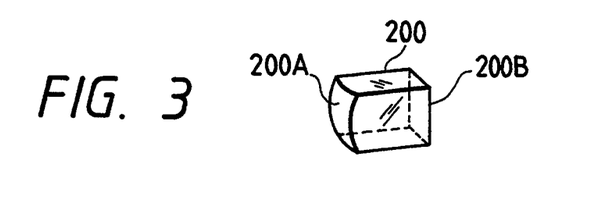
FIG. 3 is a perspective view showing a profile of a lens element partly constituting a first optical integrator in the first embodiment.

Now, each of the fly eye lenses (20a–20d) is composed of an aggregation of bar-like lens elements. As illustrated in a perspective view of FIG. 3, the lens element assumes a square in section corresponding to the sectional shape of the beam. The lens element has a convex lens surface 200A on its incident side but a plane surface 200B on its exit side. Note that differences in the focal length between these fly eye lenses (20a–20d) are, as shown in FIG. 3, attainable by making different radii of curvature of the lens surfaces 200A.

For this reason, as shown in FIG. 1A, if the fly eye lens 20a is inserted in the illumination light path, the parallel beams emitted from the light source 1 and passing through the fly eye lens 20a form the same number of converging points as that of the lens elements on undergoing the converging action of each of the lens elements 200. Substantially first surface illuminants (secondary illuminants) A are formed on the exit side of the fly eye lens 20a.

Note that each of the lens elements 200 of the fly eye lenses (20a–20d) has the lens surface on its incident side but the plane surface on its exit side in this embodiment. The parallel beam supplying means is constructed of a mercury-arc lamp, an elliptical mirror for converging rays of light from the mercury-arc lamp, and a collimator lens for collimating the condensed rays of light. In this case, however, the exit surface of each lens element 200 is provided preferably with action as a lens.

The first surface illuminants (the secondary illuminants) A are each set to a predetermined size a fixed aperture stop 3. The fixed aperture stop 3 is disposed in the position A where these surface illuminants are formed or in the vicinity thereof and is formed with an opening taking a predetermined shape. The beams from the first surface illuminants (the secondary illuminants) A are substantially collimated by a first condenser lens 4 (a first converging optical system) and led to a second optical integrator 5. Therein, an incident surface B of the second optical integrator 5 is irradiated in superposition with the beams from the plurality of converging points (secondary illuminants) formed through the respective lens elements 200 constituting the fly eye lens 20a.

Figure 5:
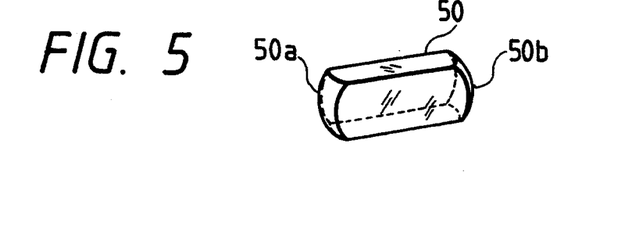
FIG. 5 is a perspective view showing a profile of the lens element partly constituting a second optical integrator in the first embodiment.

This second optical integrator 5 consists of a fly eye lens composed of a plurality of lens elements arranged in a side-by-side relationship. As illustrated in FIG. 5, a plurality of square bar-like lens elements 50 are stacked up to configure the optical integrator 5. Then, an incident surface 50A and an exit surface 5B of each bar-like lens element 50 are each shaped as a convex lens surface. A converging point is formed on the exit surface of each bar-like lens element 50, i.e., in a rear focal position. An illuminant image is formed in this position. Hence, as viewed throughout the second optical integrator, a multiplicity of converging points are formed on the exit sides (the rear focal positions) thereof. Formed are the number of converging points which corresponds to a product of the number of the bar-like lens elements 200 of one fly eye lens in the first optical integrator 2 and the number of the bar-like lens elements 50 constituting the fly eye lens as the second optical integrator. More uniform second surface illuminants (tertiary illuminants) are formed on this surface C.

Incidentally, the position A (the exit position of the first optical integrator) of the secondary illuminants (the first surface illuminants) formed with the plurality of converging points is so arranged as to be conjugate to the position C (the exit position of the second optical integrator 5) of the tertiary illuminants (the second surface illuminants) formed with the plurality of converging points with respect to a system including the first condenser lens 4 and the incident surfaces 50A of the second optical integrator.

Herein, the rotary support member P is rotated through the driving means 13. Inserted in the illumination light path is a fly eye lens different from the fly eye lens which has already been inserted in the illumination light path. A size of the second surface illuminants (the tertiary illuminants) C is thereby varied. A variable aperture stop 6 has a variable aperture and an opening assuming a predetermined shape. Then, the variable aperture stop 6 is provided in the position C where the second surface illuminants (the tertiary illuminants) are formed or in the vicinity thereof. The size of the second surface illuminants (the tertiary illuminants) is thereby precisely determined.

Now, the beams from the second surface illuminants (the tertiary illuminants) C each set to a proper size by means of the variable aperture stop 6 are collimated by a second condenser lens 7 (a second converging optical system). The collimated beams are led onto a reticle (mask) R defined as an irradiated surface. The reticle R is irradiated in superposition with the beams, thus providing a highly uniform illumination.

A predetermined circuit pattern is formed on this reticle R. An image of the predetermined circuit pattern on the reticle R is projected on a wafer W disposed in a position conjugate to this reticle R with respect to a projection lens 8.

In General, if the numerical aperture NA of a projection objective lens increases when exposure-printing a hyperfine pattern, a limit resolution is improved, but on the other hand a focal depth becomes small. Whereas if the numerical aperture NA is decreased, the limit resolution is worsened, but on the other hand the focal depth becomes large. For this reason, a variable aperture stop 8a with a variable aperture is correspondingly disposed in a pupil (entrance pupil) position of the projection lens 8. Hence, the aperture thereof is properly changed and set to a value optimal to a predetermined minimum line width pattern to be exposure-printed. The sharper hyperfine pattern can be transferred on the wafer while maintaining the relatively large focal depth.

Note that the variable aperture stop 6 of the illumination optical system and the variable aperture stop 8a are so constructed as to be conjugate to each other, wherein the stop 6 is provided in the position C formed with the second surface illuminants (the tertiary illuminants), and the stop 8a is provided in the pupil position of the projection objective lens 8. Further, the superposed position of the multiplicity of beams from the secondary illuminants A (the first surface illuminants) formed through the first optical integrator 20 is so arranged as to be conjugate to the reticle (the irradiated surface) R with respect to the incident lens surfaces 50b of the second optical integrator and the second condenser lens 7 as well. This position is defined as, i.e., the incident surface (the front focal position of the second optical integrator) B of the second optical integrator 20.

Next, the principle of changing the numerical aperture NA of the illumination optical system according to this invention will be explained with reference to FIGS. 4A and 4B.

Figure 4A:
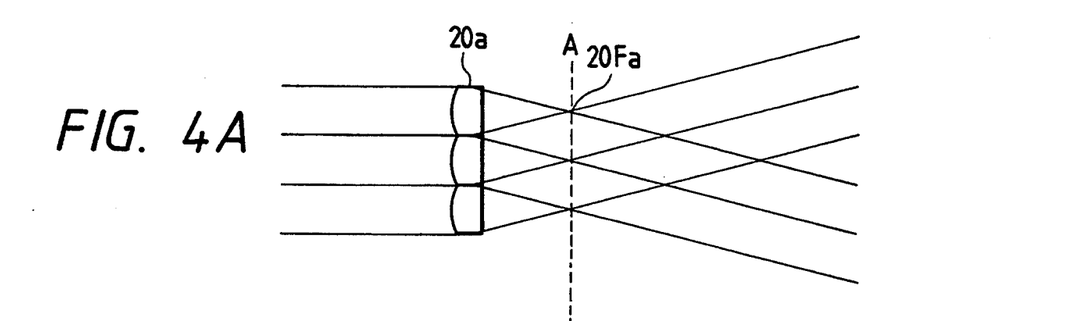
FIGS. 4A and 4B are views showing a principle of the first embodiment of this invention.
Figure 4B:
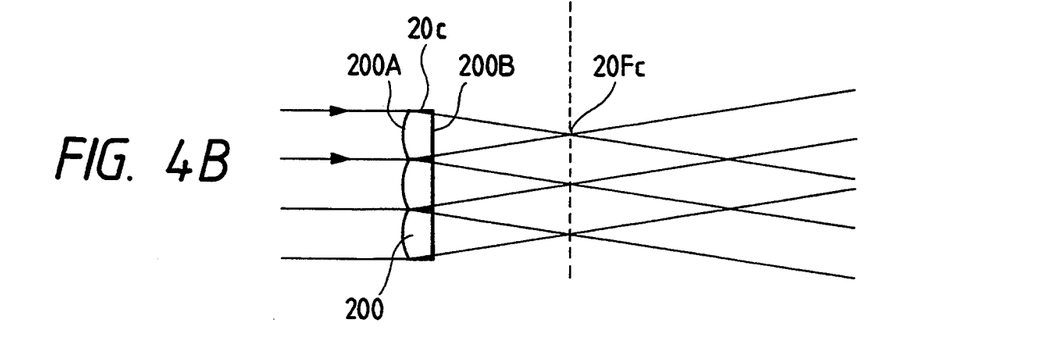

FIGS. 4A and 4B are views illustrating a configuration of the first optical integrator 20 and the light path. FIG. 4A shows a state where the fly eye lens 20a having the shortest focal length is inserted in the illumination light path. FIG. 4B shows a state where the fly eye lens 20d having the longest focal length is inserted in the illumination light path.

Referring again to FIGS. 4A and 4B, the respective fly eye lenses 20a–20d are, though only 20a and 20c are sketched, arranged so that rear focal positions 20Fa–20Fd of the lens elements are each set invariably in the same position, viz., the front focal position of the condenser lens 4.

To start with, as shown in FIG. 4A, the fly eye lens 20a composed of an aggregation of the lens elements having the shortest focal length is inserted in the illumination light path. In this case, the beams coming from the lens elements 200 of the fly eye lens 20a via the condenser lens 4, as illustrated in FIG. 1, fall in superposition on an incident surface B of the second optical integrator 5 with a size (a beam diameter or beam width) enough to cover substantially the whole of the incident surface B of the second optical integrator 5.

Only the size is thereby varied at a high efficiency without shifting the position conjugate to the first surface illuminants (the secondary illuminants), i.e., the position of the substantial second surface illuminants (the tertiary illuminants) formed on the exit surface C of the second optical integrator 5. As shown in FIG. 1, the numerical aperture NA of the illumination optical system becomes sin $\theta_W$.

Next, the rotary support member P is rotated through the driving means 13 and the fly eye lens 20c having the longest focal length is inserted in the illumination light path. In this case, as depicted in FIG. 4B, an exit angle varies without changing the size and position of the substantial first surface illuminants (the second illuminants) formed in an exit space A of the fly eye lens 20a. Note that this is the same as inserting the other fly eye lenses 20a–20c.

Then, as shown in FIG. 3, the beams traveling from the fly eye lens 20d via the condenser lens 4 fall in superposition on the incident surface B of the second optical integrator 5 with a size (a beam diameter or beam width) enough to cover a part of the incident surface B of the second optical integrator 5.

Only the size is thereby varied at the high efficiency without shifting the position conjugate to the first surface illuminants (the secondary illuminants), i.e., the position of the second surface illuminants (the tertiary illuminants) consisting of the plurality of converging points formed on the exit surface C of the second optical integrator 5. As a result, the numerical aperture NA of the illumination optical system changes, as shown in FIGS. 1A, 1B and 3, from NA=sin $\theta_W$ to NA=sin $\theta_T$. The substantial numerical aperture NA of the illumination optical system is reduced.

As discussed above, the first optical integrator 20 incorporates a discontinuous variable power function (a function to make the focal length discontinuously variable). The change in the substantial numerical aperture (NA) for the beams coming from the illumination optical system for irradiating the reticle R with the light is thereby attained without changing an irradiated area on the reticle (the irradiated surface) R. A change to an optimum $\sigma$-value can be obtained while keeping the high illumination efficiency.

The explanation has been centered so far on the optical configuration. Next, however, the actions for setting the optimum $\sigma$-value will be described with reference to FIGS. 1A, 1B and 3. Inputted to an input means 11 are items of information about the minimum line width for the exposure-printing, the focal depth of the projection objective lens 8, the $\sigma$-value or the numerical aperture NA of the illumination optical system and the numerical aperture NA of the projection objective lens. The information is stored in a memory of this input means 11 on one hand, and these items of information are displayed on a CRT monitor of an unillustrated display unit on the other hand. Subsequently, the information stored in the memory of the input means 11 is outputted to a control means 12. A CPU provided in an interior of this control means 12 calculates a variation in the aperture which matches with a magnitude of the optimum aperture of the variable aperture stop 8a so that the numerical aperture NA of the projection objective lens comes to an optimum value. Further, the CPU in the control means 12 calculates a size of optimum tertiary illuminant image C formed through the second optical integrator 6 on the basis of the optimum NA value of the projection objective lens. At the same time, the CPU selects one of the fly eye lenses (20a–20d) combined to form the first optical integrator 20.

Next, the control means 12 commands a second aperture variable means 15 to change the variable aperture stop 8a of the projection objective lens 8 to an aperture having a proper size. The control means 12 commands a first aperture variable means 14 to change the variable aperture stop 6 of the illumination optical system to an aperture having a proper size. Simultaneously, the control means 12 commands that the driving means 13 should insert an appropriate fly eye lens among the fly eye lenses (20a–20d) into the illumination light path. The driving means 13 has, in addition to the driving unit including the motor, etc., a built-in displacement detector such as an encoder for detecting locations of the fly eye lenses (20a–20d). Further, the first and second aperture variable means 14, 15 also have, in addition to the driving units including the motors, etc., built-in aperture displacement detectors each capable of detecting a size of the aperture. Hence, the output from the control means 12 serves to precisely set the sizes of apertures of the variable aperture stop 8a of the projection objective lens 8 and of the variable aperture stop 6 of the illumination optical system. At the same time, the discontinuous variation in power exactly takes place through the first optical integrator 20. Accordingly, the size of the tertiary illuminant image formed through the second optical integrator 5 is properly set. The size of the pupil of the projection objective lens 8 is also appropriately set. It is therefore possible to perform the exposure-printing with a desired optimum $\sigma$-value at the high illumination efficiency.

As explained earlier, the change to the proper $\sigma$-value can be made at the high illumination efficiency. It is thus possible to attain the illumination in the optimum illuminating state corresponding to the minimum line width of the pattern to be printed and the focal depth as well without inducing a drop in throughput.

Note that the input means 11 shown in FIGS. 1A and 1B may calculate a proper $\sigma$-value from the information only about the minimum line width inputted. Based on a calculated result of this σ-value, the control means 12 may also calculate stop-down quantities of the variable aperture stop 8a of the projection lens 8 and of the variable aperture stop 6 of the illumination optical system.

Further, the reticle R has a mark M in the form of, e.g., bar codes representing the information about the minimum line width, etc. on the wafer, the mark M being inscribed outwardly of the irradiating region of the reticle R. When using this reticle R, as illustrated in FIG. 1A relative to this embodiment as well as in FIGS. 6A and 6B relative to another embodiment which will hereinafter be mentioned, a mark detecting means MR for detecting this mark M is provided in an appropriate location. Based on the information outputted from the mark detecting means MR, the control means 12 may control the apertures of the variable aperture stop 8a of the projection lens 8 and of the variable aperture stop 6 of the illumination optical system. The control means 12 may also control the setting of the fly eye lenses (20a-20d) of the optical integrator 20. Moreover, a plurality of openings having apertures different from each other are formed along the periphery of the substrate assuming a circular shape in place of the variable aperture stop 6 of the illumination optical system in which the size of the aperture of the opening varies. There may be adopted a variable aperture stop of a turret type (revolver type) for rotating this substrate when changing the σ-value.

Further, in accordance with the embodiment shown in FIGS. 1A and 1B, the focal length of the first optical integrator 20 is changed by inserting one of the plurality of fly eye lenses (20a-20d) having difference focal lengths into the illumination light path. The size of the second surface illuminants (the tertiary illuminants) formed through the second optical integrator 5 is thereby varied. Instead of the first optical integrator 20, however, there may be disposed a second optical integrator including at least a first optical element group composed of an aggregation of a plurality of lens elements and a second optical element group similarly composed of the aggregation of the plurality of lens elements. A spacing between these two optical element groups may be discontinuously changed. The focal length of the first optical integrator is thereby changed discontinuously. It is therefore possible to discontinuously change the size of the second surface illuminants (the tertiary illuminants) formed through the second optical integrator 5.

Figure 6A:
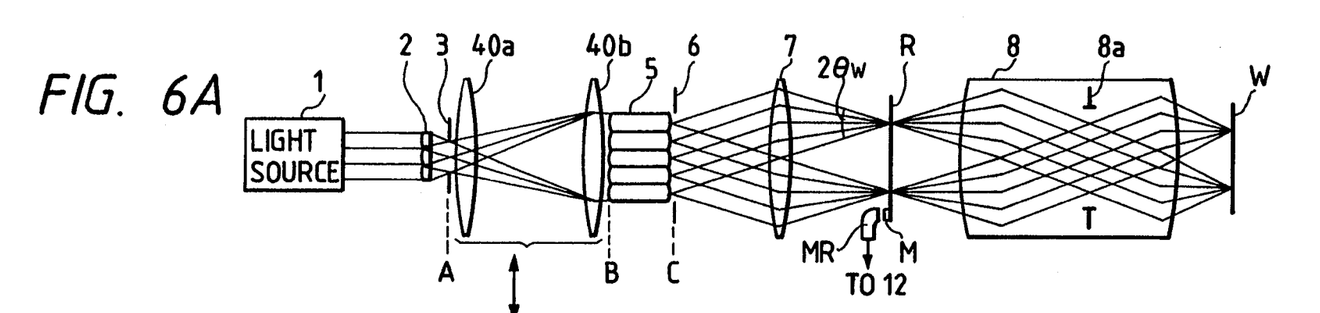
FIGS. 6A and 6B are views each illustrating a construction and a light path in a second embodiment of this invention.
Figure 6B:
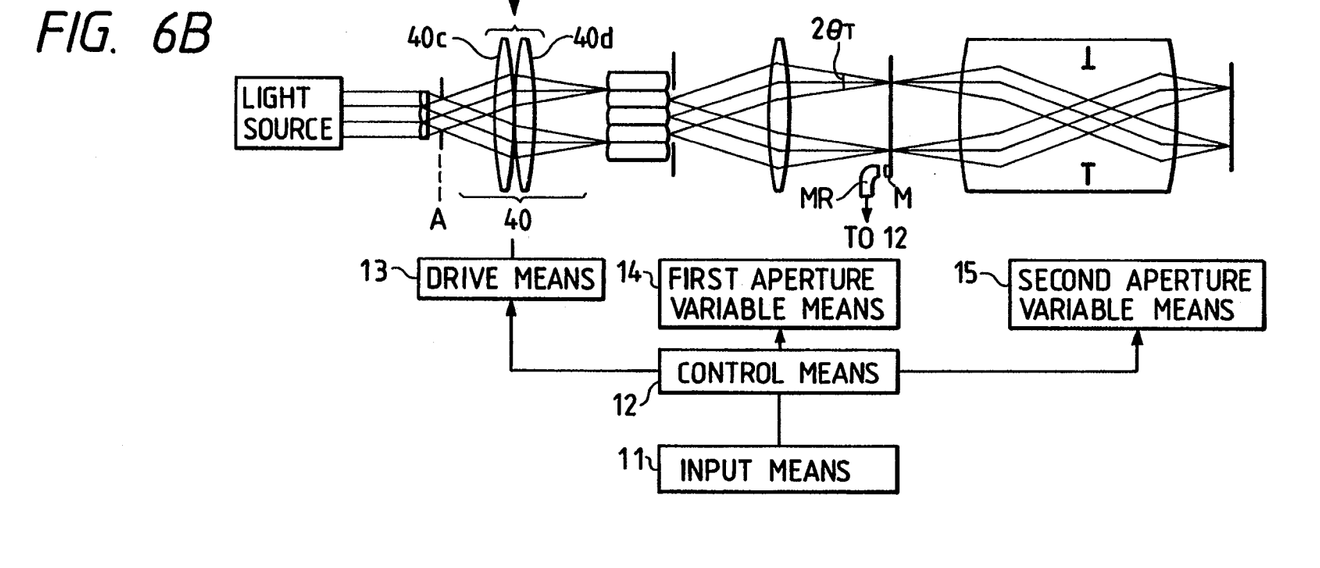

Next, another embodiment will be discussed with reference to FIGS. 6A and 6B. FIG. 6A shows a state where a focal length of a first condenser lens 40 is minimized depending on a layout of a first lens system (40a, 40b). FIG. 6B illustrates a state where the focal length of the first condenser lens 40 is maximized depending on a layout of a second lens system (40c, 40d). The members exhibiting the same functions as those shown in FIGS. 1A and 1B are marked with the like symbols. The following is a difference of this embodiment from the embodiment shown in FIGS. 1A and 1B. The first optical integrator 20 having the discontinuous variable power function is replaced with a fixed optical integrator (fly eye lenses) 2 with no discontinuous variable power function. The first condenser lens 40 is provided with the discontinuous variable power function.

The first condenser lens (a first converging optical system) 40 incorporating the discontinuous variable power function includes two lens systems interchangeable each other and having different focal lengths. The first condenser lens 40 includes, i.e., a first lens system (40a, 40b) and a second lens system (40c, 40d). The first lens system (40a, 40b) and the second lens system (40c, 40d) are, as illustrated in FIGS. 6A and 6B, are so constructed as to be interchangeable through the driving means 13 so that front focal positions thereof coincide with rear focal positions of the fly eye lenses 2.

At the first onset, as illustrated in FIG. 6A, the first lens system (40a, 40b) having the longest focal length is inserted in the illumination light path. In this case, the beams coming from the lens elements configuring the fly eye lenses 2 fall in superposition on the incident surface B of the second optical integrator 5 after being transformed with a size (a beam diameter or beam width) enough to cover substantially the whole of the incident surface B of the second optical integrator 5.

Only the size is thereby varied at a high efficiency without shifting the position conjugate to the first surface illuminants (the secondary illuminants), i.e., the position of the substantial second surface illuminants (the tertiary illuminants) formed on the exit surface C of the second optical integrator 5. As shown in FIGS. 6A and 6B, the numerical aperture NA of the illumination optical system becomes $\sin \theta_W$.

Next, the second lens system (40c, 40d) having the shortest focal length is inserted in the illumination light path through the driving means 13. In this case, as depicted in FIG. 6B, the beams coming from the lens elements 200 constituting the fly eye lens 2 fall in superposition on the incident surface B of the second optical integrator 5 after being transformed with a size (a beam diameter or beam width) enough to cover a part of the incident surface B of the second optical integrator 5.

Only the size is thereby varied at the high efficiency without shifting the position conjugate to the first surface illuminants (the secondary illuminants), i.e., the position of the second surface illuminants (the tertiary illuminants) formed on the exit surface C of the second optical integrator 5. As a result, the numerical aperture NA of the illumination optical system changes, as shown in FIGS. 6A and 6B, from NA$=\sin \theta_W$ to NA$=\sin \theta_T$. The substantial numerical aperture NA of the illumination optical system is reduced.

As discussed above, the first condenser lens 40 incorporates a discontinuous variable power function. The change in the substantial numerical aperture (NA) for the beams coming from the illumination optical system for irradiating the reticle R with the light is thereby attained without changing the irradiated area on the reticle (the irradiated surface) R. A change to the optimum σ-value can be obtained while keeping the high illumination efficiency.

Note that of the optimum σ-value can be automatically set attainable by the method described in the first embodiment, and the explanation thereof will be omitted.

In each of the embodiments, shown in FIGS. 1A and 1B, 6A and 6B of the present invention, the aperture stop 3 for determining the size of the secondary illuminants formed in the exit space of the first optical integrator 2 or 20 can be configured in principle by a fixed stop. However, the aperture of this aperture stop 3 can be made variable for regulating a light quantity. Further, in accordance with this embodiment, the parallel beam supplying means involves the use of the light source such as a laser for supplying the parallel beams. The invention is not, however, limited to this. As a matter of course, a parallel beam supplying means constructed such that the beams from a high-pressure mercury-arc lamp, etc. are converged by an elliptical mirror and thereafter collimated by a collimator lens, may be employed. Further, the sectional shape of each of the bar-like lens elements constituting the optical integrator may be set properly in circular or polygonal shapes. Moreover, a spacing between the lens systems constituting the first condenser lens 40, e.g., between the lenses 40a and 40b may be discontinuously varied. The focal length of the first condenser lens 40 is thereby changed discontinuously. Therefore, the size of the second surface illuminants (the tertiary illuminants) formed through the second optical integrator 5 discontinuously changes. As a result, the numerical aperture NA of the illumination optical system can be also discontinuously varied.

Further, the embodiment shown in FIGS. 6A and 6B has presented an arrangement where the focal length of the first optical integrator 2 does not change. In place of this first optical integrator 2, however, there may be disposed the first optical integrator 20 incorporating the discontinuous variable power function (the function to make the focal length discontinuously variable) as shown in the embodiment of FIGS. 1A and 1B. The first optical integrator 20 and the first condenser lens 40 cooperate to attain the discontinuous variable power. The size of the second surface illuminants formed through the second optical integrator may be changed.

It is apparent that, in this invention, a wide range of different working modes can be formed based on the invention without deviating from the spirit and scope of the invention. This invention is not restricted by its specific working modes except being limited by the appended claims.

What is claimed is:

1. An illumination optical system comprising:
   a parallel beam supplying means for supplying a parallel beam;
   a first optical integrator for forming a first substantially planar light source by the beam from said parallel beam supplying means and generating a plurality of beams;
   a first converging optical system for converging said plurality of beams from said first substantially planar light source formed by said first optical integrator;
   a second optical integrator for forming a second substantially planar light source by said plurality of beams converged by said first converging optical system and generating multiple beams; and
   a second converging optical system for converging said multiple beams from said second substantially planar light source formed by said second optical integrator and illuminating an irradiated surface with the converged beams in superposition,
   wherein at least one of said first optical integrator and said first converging optical system includes a plurality of lens systems being interchangeable with each other and having focal lengths different from each other, and one of said plurality of lens systems is inserted in a light path with the result that a size of said second substantially planar light source is made variable while a size of an irradiated area of said surface is maintained constant.

2. The illumination optical system according to claim 1, wherein said first optical integrator includes said plurality of lens systems, said plurality of lens systems have at least a first lens system composed of an aggregation of a plurality of lens elements and a second lens system composed of an aggregation of a plurality of lens elements having focal lengths different from that of said lens elements of said first lens system, and said one lens system of said plurality of lens systems is so constructed as to be insertable into the light path.

3. The illumination optical system according to claim 2, wherein a rear focal position of said first optical integrator is so arranged as to be invariably conjugate to a rear focal position of said second optical integrator even when a focal length of said first optical integrator changes by inserting said one lens system of said plurality of lens systems into the light path.

4. The illumination optical system according to claim 1, wherein said first converging optical system includes said plurality of lens systems, said plurality of lens systems have at least a first lens system having a predetermined focal length and a second lens system having a focal length different from that of said first lens system, and said one lens system of said plurality of lens systems is so arranged as to be insertable into the light path.

5. The illumination optical system according to claim 4, wherein a rear focal position of said first optical integrator is so arranged as to be invariably conjugate to a rear focal position of said second optical integrator even when a focal length of said first optical integrator changes by inserting said one lens system of said plurality of lens systems into the light path.

6. The illumination optical system according to claim 1, wherein said parallel beam supplying means includes a light source, an elliptical mirror for converging the beams coming from said light source and a collimator lens for collimating the beams from said elliptical mirror.

7. The illumination optical system according to claim 1, wherein said parallel beam supplying means includes a laser light source for emitting ultraviolet rays.

8. An exposure apparatus for exposing a reticle pattern on a substrate through a projection optical system, comprising:
   an illumination optical system for illuminating a reticle uniformly with light,
   said illumination optical system including:
      a parallel beam supplying means for supplying a parallel beam;
      a first optical integrator for forming a first substantially planar light source by the beam from said parallel beam supplying means and generating a plurality of beams;
      a first converging optical system for converging said plurality of beams from said first substantially planar light source formed by said first optical integrator;
      a second optical integrator for forming a second substantially planar light source by the plurality of beams converged by said first converging optical system and generating multiple beams; and
      a second converging optical system for converging said multiple beams from said second substantially planar light source formed by said second optical integrator and illuminating an irradiated surface with the converged beams in superposition,
      wherein at least one of said first optical integrator and said first converging optical system includes a plurality of lens systems being interchangeable with each other and having focal lengths different from each other, and one of said plurality of lens systems is inserted in a light path with the result that a size of said second substantially planar light source is made variable while a size of an irradiated area of said surface is maintained constant.

9. The exposure apparatus according to claim 8, further comprising a first variable aperture stop disposed in a position of said second substantially planar light source, a second variable aperture stop disposed in a pupil position of said projection optical system, an input means for inputting the information required for setting an optimum illumination state, a driving means for inserting one of said plurality of lens systems into the light path and a control means for controlling said first variable aperture stop, said second variable aperture stop and said driving means on the basis of the information inputted to said input means.

10. The exposure apparatus according to claim 8, further comprising a first variable aperture stop disposed in a position of said second substantially planar light source, a second variable aperture stop disposed in a pupil position of said projection optical system, an input means for inputting the information required for setting an optimum illumination state, a driving means for inserting one of said plurality of lens systems into the light path, a mark detecting means for detecting a predetermined mark, formed on said reticle, to which the information required for setting an optimum illumination state is written and a control means for controlling said first variable aperture stop, said second variable aperture stop and said driving means on the basis of outputs from said mark detecting means.

11. The exposure apparatus according to claim 8, wherein said first optical integrator includes said plurality of lens systems, said plurality of lens systems have at least a first lens system having a plurality of lens elements and a second lens system having a plurality of lens elements exhibiting focal lengths different from those of said lens elements of said first lens system, and said one lens system of said plurality of lens systems is so arranged as to be insertable into the light path.

12. The exposure apparatus according to claim 8, wherein said first converging optical system of said illumination optical system includes said plurality of lens systems, said plurality of lens systems have at least a first lens system having a predetermined focal length and a second lens system having a focal length different from that of said first lens system, and said one lens system of said plurality of lens systems is so arranged as to be insertable into the light path.

13. An illumination optical system comprising:
a parallel beam supplying means for supplying a parallel beam;
a first optical integrator for forming a plurality of beams by use of the beam from said parallel beam supplying means;
a first converging optical system for converging said plurality of beams formed by said first optical integrator;
a second optical integrator for further forming a plurality of beams by use of said plurality of beams converged by said first converging optical system; and
a second converging optical system for converging the plurality of beams formed by said second optical integrator and illuminating an irradiated surface with said converged beams in superposition,
wherein said first optical integrator includes at least a first lens system having a plurality of lens elements and a second lens system having a plurality of lens elements exhibiting focal lengths different from those of said lens elements of said first lens system, and one of said lens systems is inserted in a light path with the result that a size of said plurality of beams formed by said second optical integrator is made variable while a size of an irradiated area of said surface is maintained constant.

14. An illumination optical system comprising:
a parallel beam supplying means for supplying a parallel beam;
a first optical integrator for forming a plurality of beams by use of the beam from said parallel beam supplying means;
a first converging optical system for converging said plurality of beams formed by said first optical integrator;
a second optical integrator for further forming a plurality of beams by use of said plurality of beams converged by said first converging optical system; and
a second converging optical system for converging said plurality of beams formed by said second optical integrator and illuminating an irradiated surface with said converged beams in superposition,
wherein said first converging optical system includes at least a first lens system having a predetermined focal length and a second lens system having a focal length different from that of said first lens system, and one of said lens systems is inserted in a light path with the result that a size of said plurality of beams formed by said second optical integrator is made variable while a size of an irradiated area of said surface is maintained constant.

15. An illumination optical system comprising:
a parallel beam supplying system for supplying parallel beam;
a first multi-beam forming optical system for forming a plurality of beams by the beam from said parallel beam supplying system;
a first converging optical system for converging the plurality of beams from said first multi-beam forming optical system;
a second multi-beam forming optical system for forming a plurality of beams by said plurality of beams converged by said first converging optical system; and
a second converging optical system for converging said plurality of beams from said second multi-beam forming optical system and illuminating an irradiated surface with the converged beams in superposition,
wherein at least one of said first multi-beam forming optical system and said first converging optical system is constructed to make a focal length discontinuously variable, and a size of said plurality of beams formed by said second multi-beam forming optical system is made discontinuously variable by the discontinuous change in said focal length while a size of an irradiated area of said surface is maintained constant.

* * * * *